US010651308B2

(12) United States Patent
Gluschenkov et al.

(10) Patent No.: US 10,651,308 B2
(45) Date of Patent: *May 12, 2020

(54) SELF ALIGNED TOP EXTENSION FORMATION FOR VERTICAL TRANSISTORS

(71) Applicant: INTERNATIONAL BUSINESS MACHINES CORPORATION, Armonk, NY (US)

(72) Inventors: Oleg Gluschenkov, Tannersville, NY (US); Sanjay C. Mehta, Niskayuna, NY (US); Shogo Mochizuki, Clifton Park, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/043,637

(22) Filed: Jul. 24, 2018

(65) Prior Publication Data
US 2018/0331216 A1   Nov. 15, 2018

Related U.S. Application Data

(60) Continuation of application No. 15/626,680, filed on Jun. 19, 2017, now Pat. No. 10,079,299, which is a (Continued)

(51) Int. Cl.
H01L 29/76     (2006.01)
H01L 29/78     (2006.01)
(Continued)

(52) U.S. Cl.
CPC ...... *H01L 29/7827* (2013.01); *H01L 21/0257* (2013.01); *H01L 21/26506* (2013.01);
(Continued)

(58) Field of Classification Search
CPC .................... H01L 21/0257; H01L 21/26506
See application file for complete search history.

(56) References Cited

U.S. PATENT DOCUMENTS 9,018,055 B2   4/2015  Currie
9,159,812 B1   10/2015 Hsiao et al.
(Continued)

FOREIGN PATENT DOCUMENTS

WO    2015147866 A1   10/2015

OTHER PUBLICATIONS

U.S. Appl. No. 16/555,187.*
List of IBM Patents or Patent Applications Treated as Related dated Jul. 24, 2018, 2 pages.

*Primary Examiner* — Samuel A Gebremariam
(74) *Attorney, Agent, or Firm* — Tutunjian & Bitetto, P.C.; Daniel P. Morris

(57) ABSTRACT

A method of forming a semiconductor device that includes providing a vertically orientated channel region; and converting a portion of an exposed source/drain contact surface of the vertically orientated channel region into an amorphous crystalline structure. The amorphous crystalline structure is from the vertically orientated channel region. An in-situ doped extension region is epitaxially formed on an exposed surface of the vertically orientated channel region. A source/drain region is epitaxially formed on the in-situ doped extension region.

20 Claims, 5 Drawing Sheets

Related U.S. Application Data division of application No. 15/332,181, filed on Oct. 24, 2016, now Pat. No. 9,748,382.

(51) Int. Cl.

| | |
|---|---|
| *H01L 29/66* | (2006.01) |
| *H01L 21/265* | (2006.01) |
| *H01L 21/306* | (2006.01) |
| *H01L 21/02* | (2006.01) |
| *H01L 29/08* | (2006.01) |
| *H01L 29/10* | (2006.01) |
| *H01L 29/165* | (2006.01) |

(52) U.S. Cl.
CPC .... *H01L 21/30604* (2013.01); *H01L 29/0847* (2013.01); *H01L 29/1037* (2013.01); *H01L 29/66666* (2013.01); *H01L 21/0262* (2013.01); *H01L 21/02532* (2013.01); *H01L 21/02636* (2013.01); *H01L 29/165* (2013.01)

(56) References Cited

U.S. PATENT DOCUMENTS

| | | | |
|---|---|---|---|
| 9,263,580 B2 | 2/2016 | Jacob et al. | |
| 9,324,713 B1 | 4/2016 | Yu et al. | |
| 9,337,306 B2 | 5/2016 | Peng et al. | |
| 9,362,285 B2 | 6/2016 | Basker et al. | |
| 9,397,200 B2 | 7/2016 | Qi | |
| 10,079,299 B2* | 9/2018 | Gluschenkov | H01L 29/7827 |
| 2006/0197125 A1 | 9/2006 | Langdo et al. | |
| 2011/0024794 A1* | 2/2011 | Ko | H01L 29/66795 |
| | | | 257/190 |
| 2012/0319201 A1* | 12/2012 | Sun | H01L 21/823487 |
| | | | 257/338 |
| 2013/0248942 A1 | 9/2013 | Okano | |
| 2014/0021485 A1* | 1/2014 | Cho | H01L 29/1054 |
| | | | 257/77 |
| 2015/0279975 A1* | 10/2015 | Hsiao | H01L 29/66818 |
| | | | 257/401 |
| 2016/0064387 A1 | 3/2016 | Jeong et al. | |
| 2016/0163826 A1 | 6/2016 | Cheng et al. | |
| 2016/0190251 A1 | 6/2016 | Feng et al. | |

\* cited by examiner

SELF ALIGNED TOP EXTENSION FORMATION FOR VERTICAL TRANSISTORS

BACKGROUND

Technical Field

The present invention generally relates to vertically orientated semiconductor devices, and more particularly to vertical fin field effect transistors (V-FinFETs).

Description of the Related Art

The dimensions of semiconductor field effect transistors (FETs) have been steadily shrinking, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one embodiment, a method of forming a semiconductor device is provided that includes providing a vertically orientated channel region; and converting a portion of an exposed source/drain contact end of the vertically orientated channel region into an amorphous crystalline structure. A remainder of the vertically oriented channel region has a non-amorphous crystal structure. The amorphous crystalline structure is removed selectively to the remainder of the vertically oriented channel region that has a non-amorphous crystal structure. An in-situ doped extension region is epitaxially formed on an exposed surface of the vertically orientated channel region. A source/drain region is epitaxially formed on the in-situ doped extension region.

In another embodiment, the method of forming the semiconductor device includes providing a vertically orientated channel region to a first source/drain region; and forming a gate structure onto the vertically orientated channel. An exposed source/drain contact surface is present on a side of the vertically orientated channel region opposite the first source/drain region. The exposed source/drain contact surface extends through a spacer dielectric layer. A portion of the exposed source/drain contact surface is converted into an amorphous crystalline structure. A remainder of the vertically oriented channel region has a non-amorphous crystal structure. The amorphous crystalline structure is removed from the vertically orientated channel region. The method continues with epitaxially forming an in-situ doped extension region on an exposed surface of the vertically orientated channel region, and epitaxially forming a second source/drain region on the in-situ doped extension region.

In another aspect of the disclosure, a semiconductor device is provided that includes a first source/drain region on a supporting substrate; and a vertically orientated channel region atop the first source/drain region. An extension of the first source/drain region is present in a first end of the vertically orientated channel region including diffused dopant extending from the first source/drain region. An extension of the first source/drain region is present at a first end of the vertically orientated channel region that includes a portion of the doped semiconductor material that provided the first source/drain region. The epitaxial uniformly doped extension region layer is a separate layer from the vertically orientated channel region and the second source/drain region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
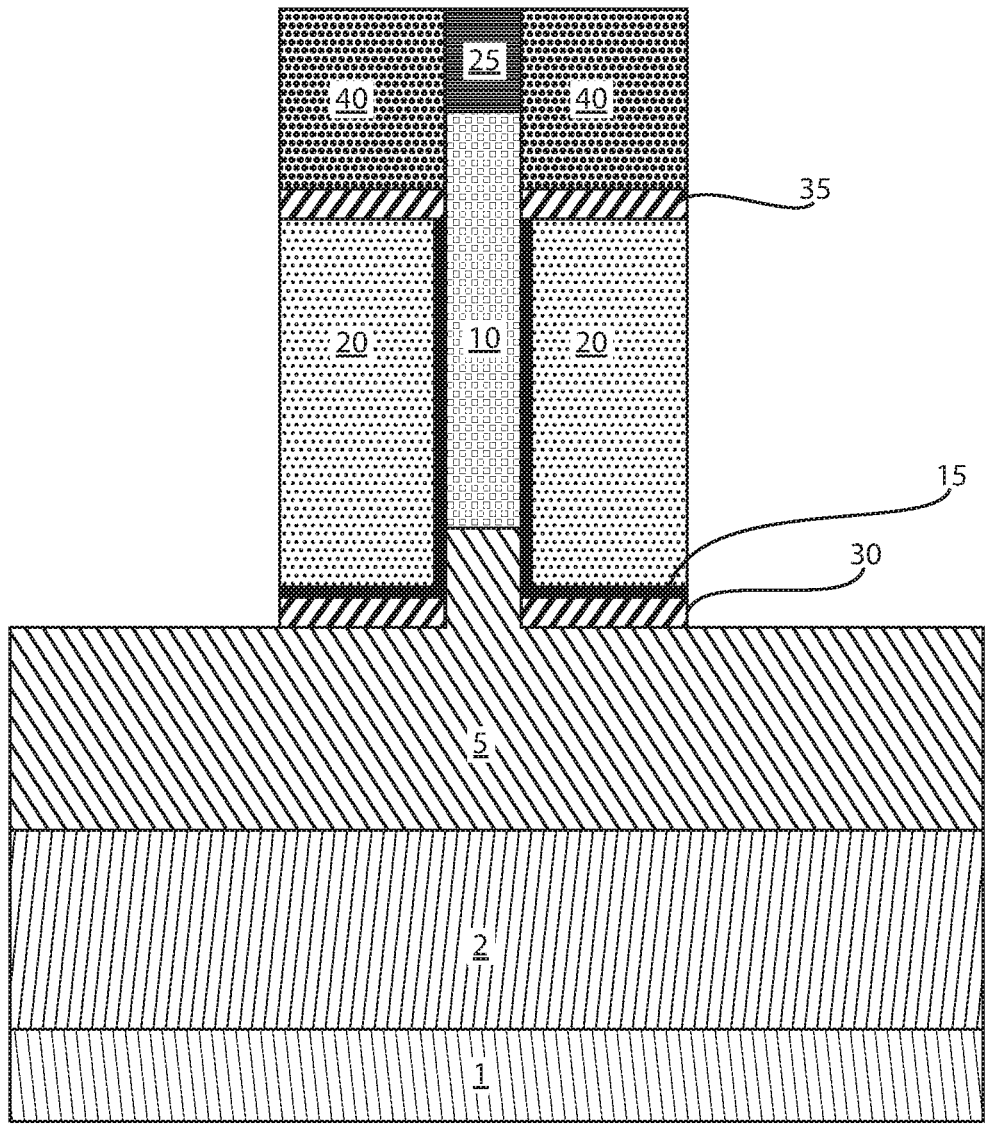
FIG. 1 is a side cross-sectional view depicting a structure including a vertically orientated channel region atop a first source/drain region that is present on a supporting substrate, in which a gate structure is present around the vertically orientated channel region, and a dielectric cap is present on upper most surface of the vertically oriented channel region that is opposite the side of the vertically orientated channel region that is in direct contact with the first source/drain region.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A FinFET is a semiconductor device that positions the channel region of the semiconductor device in a fin structure. The source and drain regions of the fin structure are the portions of the fin structure that are on opposing sides of the channel region of the fin structure.

A FinFET semiconductor device has the drain, fin channel, and source device components arranged perpendicular to the plane of the substrate surface, which is referred to as a vertical stack (also referred to as vertical FinFET). In some embodiments, the methods and structures disclosed herein apply to vertical FinFETs, which are also referred to as a vertically stacked FinFET. A vertically stacked FinFET can have a longer gate length (i.e., height) and larger dielectric spacer than a horizontal (i.e., having the drain, fin channel, and source device components arranged parallel with the plane of the substrate surface) FinFET having comparable contact gate pitch.

It has been determined that forming the top contact, e.g., source/drain region, of a vertically orientated transistor, as well as the extension region, can be challenging, as alignment of these structures with respect to the gate structure can be dependent upon lithography and etch processes that can be reaching their limits with increased scaling of devices. In some embodiments, the methods and structures disclosed herein can provide a method for controlling the extension region placement in vertical field effect transistor (VFET) and vertical tunnel junctions. In some embodiments, the methods and structures disclosed herein provide for precise placement of the extension region that is present overlying the supporting substrate by converting a portion of a vertically orientated channel region into an amorphous semiconductor material and employing a selective etch process that removes an amorphous semiconductor material selectively to a non-amorphous semiconductor material, which is followed by an epitaxial in-situ growth process for forming the extension region junction. Further details of the methods and structures of the present disclosure are now provided with reference to FIGS. 1-5.

FIG. 1 depicts one embodiment of a partial vertical transistor, i.e., vertical FinFET, which includes a vertically orientated channel that is positioned within a fin structure 10 composed of semiconductor material. The vertically orientated channel region that is present in the fin structure 10 is atop a first source/drain region 5 that is present overlying a supporting substrate 1. In some embodiments, a gate structure 15, 20 is present around the vertically orientated channel region that is provided by the fin structure 10. The gate structure 15, 20 may include at least one gate dielectric 15, and at least one gate conductor 20. A first dielectric spacer 30 is present between the gate structure 15, 20 and the first source/drain region 5.

In some embodiments, a dielectric cap 25 (also referred to as a hardmask) is present on upper most surface of the vertically oriented channel region that is positioned with the fin structure 10. The dielectric cap 25 is present on the end of the fin structure 10 that is opposite the side of the fin structure 10 that is in direct contact with the first source/drain region 5. The dielectric cap 25 is present atop the fin structure 10 and has an upper surface that is coplanar with a dielectric stack of a second dielectric spacer 35 and an interlevel dielectric 40. The structure depicted in FIG. 1 may also include a punch through stopper (PST) region 2 that is present between the first source/drain region 5 and the supporting substrate 1.

In some embodiments, the supporting substrate 1 is composed of a type I-V semiconductor material. By "type IV semiconductor" it is meant that the semiconductor material includes at least one element from Group IVA (i.e., Group 14) of the Periodic Table of Elements. Examples of type IV semiconductor materials that are suitable for the supporting substrate 5 include silicon (Si), germanium (Ge), silicon germanium (SiGe), silicon doped with carbon (Si:C), silicon germanium doped with carbon (SiGe:C) and a combination thereof. In other embodiments, the supporting substrate 1 may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the supporting substrate 5 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In an embodiment, the supporting substrate 1 is a single crystal silicon wafer.

The punch-through stopper (PTS) region 2 can reducing the incidence of leakage based performance degradation in FinFETs. The punch-through stopper (PTS) 2 improves FinFET characteristics. The dopant for forming the punch-through stop (PTS) region 2 may be an n-type or p-type dopant that has an opposite conductivity type as the dopant that determined the conductivity type of the FinFET. The term "conductivity type" denotes whether a region is doped to an n-type or p-type conductivity. For example, the punch-through stop (PTS) region dopant may be an n-type or p-type dopant that has an opposite conductivity type as the dopant that dictates the conductivity type of the source and drain region of the FinFET. The punch-through stopper region 2 may be forming in an upper surface of the supporting substrate 1 by ion implantation. In other embodiments, the punch-through stopper region 2 is formed by epitaxially forming an in-situ doped semiconductor material atop the supporting substrate 1. Although the supplied figures depict the presence of the PST region, the PST region 2 is optional, and may be omitted.

The first source/drain region 5 is present atop the PST region 2. The first source/drain region 5 may be composed of a type IV or type III-V semiconductor. The above examples of semiconductor materials that are suitable for providing the supporting substrate 1, are suitable for providing examples of materials that can be used for the first source/drain region 5. In some embodiments, the first source/drain region 5 provides the source region of the device, and the later formed second source/drain region provides the drain region of the device. In some other embodiments, the first source/drain region 5 provides the drain region of the device and the later formed second source/drain region provides the source region of the device. The first source/drain region 5 is typically doped to a conductivity type that provides the conductivity type of the semiconductor device. For example, if the first source/drain region 5 is doped to an n-type conductivity, the semiconductor device is an n-type device, e.g., an n-type vertical FinFET. For example, if the first source/drain region 5 is doped to a p-type conductivity, the semiconductor device is a p-type device, e.g., a p-type vertical FinFET.

The first source/drain region 5 may be provided by an upper surface of the supporting substrate 1 that is doped to the required conductivity type using ion implantation. In other embodiments, the first source/drain region 5 may be composed of a semiconductor material that is deposited atop the PST region 2 (when present) or the supporting substrate. When the first source/drain region 5 is composed of a deposited material, the semiconductor material that provides the first source/drain region 5 may be epitaxially formed, i.e., formed by an epitaxial growth and/or deposition process. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD). In the embodiments, in which the first source/drain region 5 is composed of an epitaxially formed silicon containing material, the silicon gas source for epitaxial deposition may be selected from the group consisting of Silane (SiH4), disilane (Si2H6), or higher order silanes, hexachlorodisilane ($Si_2Cl_6$), tetrachlorosilane ($SiCl_4$), dichlorosilane ($Cl_2SiH_2$), trichlorosilane ($Cl_3SiH$), and combinations thereof.

To provide the appropriate conductivity type of the first source/drain region 5, the semiconductor material that provides the source/drain region may be doped with an n-type or p-type dopant. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous. In some embodiments, the dopant that dictates the conductivity type of the first source/drain region is introduced in-situ. By "in-situ" it is meant that the dopant that dictates the conductivity type of the semiconductor material that provides the first source/drain region 5 is introduced during the process step, e.g., epitaxial deposition. Alternatively, the dopant that provides the conductivity type of the first source/drain region 5 is introduced by ion implantation. The dopant for the epitaxial semiconductor material that dictates the conductivity type of the first source/drain region is typically present in a concentration ranging from $2\times10^{20}$ atoms/cm$^3$ to $2\times10^{21}$ atoms/cm$^3$.

The fin structure 10 is present in direct contact with the first source/drain region 5. The fin structure 10 may be composed of a type IV or type III-V semiconductor. The above examples of semiconductor materials that are suitable for providing the supporting substrate 1, are suitable for providing examples of materials that can be used for the fin structure 10. The fin structure 10 may be formed using an epitaxial growth process atop the semiconductor material layer that provides the first source/drain region 5. In some embodiments, when the first source/drain region 5 is composed of a crystalline semiconductor, such as a single crystal semiconductor, e.g., monocrystalline silicon (c-Si), the epitaxially formed semiconductor material layer for providing the fin structure 10 will also be composed of monocrystalline silicon.

In some embodiments, a blanket deposition is first conducted, in which the blanket deposited material layer is patterned and etched to provide the fin structure 10. In some embodiments, the etch process for forming the fin structure 10, also etches a portion of the semiconductor material layer that provides the first source/drain region 5. This can provide a pedestal of semiconductor material from the first source/drain region 5 having a width dimension equal to the width of the fin structure 5.

The pattern and etch processes for forming the fin structure 5 may employ a hard mask, which can provide the dielectric cap 25. More specifically, after forming a blanket layer of semiconductor material for the fin structure 5 atop the first source/drain region 5, a dielectric material layer may be deposited for forming the hard mask, i.e., dielectric cap 25. The dielectric material layer may then be patterned using photolithography, e.g., by forming a photoresist mask, and etched using an anisotropic etch process, such as reactive ion etch (RIE). Following patterning of the dielectric material layer for forming the hard mask, i.e., dielectric cap 25, the epitaxial semiconductor material, e.g., crystalline semiconductor material, may be etched to provide the fin structure 10. The etch process for forming the fin structure 10 may be an anisotropic etch, such as reactive ion etch (RIE).

It is noted that the above subtractive method for defining the geometry of the fin structure 10 is only one example of a method for forming the fin structure 10. In another example, a dielectric material layer may be deposited first source/drain region 5. The dielectric material layer may be a dielectric material, such as silicon nitride, that can be deposited using chemical vapor deposition (CVD), such as plasma enhanced chemical vapor deposition (PECVD). A trench may be formed in the dielectric material layer using etch processes, such as reactive ion etch (RIE), wherein the base of the trench exposes a surface of the first source/drain region 5 to provide an epitaxial growth site. The fin structure 10 is then epitaxially formed extending from the epitaxial growth site at the bottom of the trench provided by the first source/drain region 5, in which the epitaxial semiconductor material fills the trench. The dielectric material layer that provided the trench dictating the geometry for the fin structure 10 may then be removed, e.g., by selective etching.

Each of the fin structures 10 may have a height ranging from 5 nm to 200 nm. In another embodiment, each of the fin structures 10 has a height ranging from 10 nm to 100 nm. In one example, each of the fin structures 10 has a height ranging from 20 nm to 50 nm. Each of the plurality of fin structures 10 may have a width of less than 20 nm. In another embodiment, each of the fin structures 10 has a width ranging from 3 nm to 8 nm.

Still referring to FIG. 1, following formation of the fin structure 10, the first dielectric spacer 30 may be formed. The first dielectric spacer 30 may be composed of an oxide, nitride or oxynitride material. In some embodiments, the first dielectric spacer 20 is composed of silicon nitride formed using chemical vapor deposition (CVD), e.g., plasma enhanced chemical vapor deposition (PECVD).

In some embodiments, the first dielectric spacer 30 may be composed of a low-k dielectric material. The term "low-k" denotes a dielectric material having a dielectric constant equal to the dielectric constant of silicon oxide ($SiO_2$) or less, i.e., less than 3.9. In one embodiment, the low-k dielectric material has a dielectric constant ranging from 1.75 to 3.5. Examples of materials suitable for the low-k dielectric material include diamond like carbon (DLC), organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The low-k spacer material may be deposited using at least one of spin on deposition, chemical vapor deposition (CVD), plasma-assisted CVD, evaporation and chemical solution deposition.

Referring to FIG. 1, in some embodiments, during patterning of the fin structure 10, a portion of the first source/drain region 5 is etched, in which a pedestal portion of the first source/drain region 5 has a same width as the fin structure 10. The overlap of the pedestal portion of the first source/drain region 5 and the first dielectric spacer 20 provides an extension region of n-type or p-type dopant that extends from the first source/drain region 5 towards the vertically orientated channel region that is positioned within the fin structure 10. It is noted that the degree of overlap is exaggerated in the supplied figures. Typically, the fin structures 10 are formed using SIT processing. In some embodiments, the source/drain epitaxial is grown at the bottom of the fin structures 10 and between the fin structures 10 at the bottom. in which the source/drain epitaxial material is underlying the fin structures 10. The epitaxial material for the source/drain regions is between the fins at the bottom. Thereafter, dopant from the epitaxial material is diffused into the bottom portion of the fin structures 10 forming the bottom extension region. As noted, the height of the extension region has been exaggerated for ease of depiction, and the height of the extension is not this high in the device.

Following formation of the first dielectric spacer 30, the gate structure 15, 20 can be formed around the fin structure 10. The gate structure 15, 20 includes at least one gate dielectric 15 and at least one gate conductor 20. The gate dielectric 15 of the gate structure 15, 20 is first formed on the channel portion of the fin structure 10. Typically, the gate dielectric 15 is formed using a conformal deposition process. The gate dielectric 15 may be composed of any dielectric material, such as an oxide, nitride or oxynitride material. In some embodiments, the gate dielectric is a high-k dielectric material. As used herein, "high-k" denotes a dielectric material featuring a dielectric constant (k) higher than the dielectric constant of $SiO_2$ at room temperature. For example, the least one gate dielectric layer 15 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 15 include hafnium silicate, hafnium silicon oxynitride or combinations thereof.

To provide the conformal layer, the gate dielectric 15 may be deposited using atomic layer deposition (ALD). In other embodiments, the gate dielectric 15 may be deposited using chemical vapor deposition methods, such as plasma enhanced chemical vapor deposition (PECVD). In one embodiment, the thickness of the at least one gate dielectric layer 15 is greater than 0.8 nm. More typically, the at least one gate dielectric layer 15 has a thickness ranging from about 1.0 nm to about 6.0 nm. In some embodiments, conformal deposition of the gate dielectric 15 produces a vertical portion on the channel portion of the fin structure 10, and a horizontal portion that is present on the upper surfaces of the first dielectric spacer 30.

Following formation of the gate dielectric 15, a work function metal (not shown) may be deposited. The work function metal (not shown) may be selected to provide a p-type work function metal layer and an n-type work function metal layer. In one embodiment, the p-type work function metal layer is composed of titanium nitride (TiN). The p-type work function metal layer may also be composed of TiAlN, Ru, Pt, Mo, Co and alloys and combinations thereof. In one embodiment, the n-type work function metal layer is composed of at least one of TiAl, TaN, TiN, HfN, HfSi, or combinations thereof. It is noted that the work function metal is optional and may be omitted.

The gate conductor 20 may be blanket deposited over the work function metal (when present), as well as over the gate dielectric 15, or directly on the gate dielectric 15 when the work function metal is not present. In various embodiments, the gate conductor 20 is a metal, where the metal may be tungsten (W), tungsten nitride (WN) or combinations thereof. In one or more embodiments, the gate conductor 20 is tungsten (W). The gate conductor 20 may be deposited by CVD or PECVD or PVD.

FIG. 1 further depicts recessing the gate structure 15, 20 and forming a second dielectric spacer 35. Recessing the gate structure 15, 20 may begin with recessing the gate conductor 20, as well as the portion of the gate dielectric 15 to a depth below the upper surface of the fin structure 10. This etch step may be performed using reactive ion etch (RIE). The etch process for recessing the gate conductor 20 and the gate dielectric 15 to expose at least a portion of the fin structure 10 containing the vertically orientated channel region may be an etch that is selective to the dielectric cap 25 that is present on the upper surface the fin structure 10.

The second dielectric spacer 35 may be composed of an oxide, nitride or oxynitride material. In some embodiments, the second dielectric spacer 35 is composed of silicon nitride formed using chemical vapor deposition (CVD), e.g., plasma enhanced chemical vapor deposition (PECVD). In some embodiments, the second dielectric spacer 35 may be composed of a low-k dielectric material. It noted that any of the low-k dielectric materials that are described above for the first dielectric spacer 30 are suitable for describing the second dielectric spacer 30. The second dielectric spacer 35 is in direct contact with the sidewall of the fin structure 10 containing the vertically orientated channel region and is in direct contact with a portion of the gate dielectric 15 that is present on the fin structure 10.

The second dielectric spacer 35 is the lower layer of the dielectric stack that also includes an interlevel dielectric 40, in which the dielectric cap 25 that is present atop the fin structure 10 and has an upper surface that is coplanar with the dielectric stack of a second dielectric spacer 35 and an interlevel dielectric (ILD) 40. The interlevel dielectric (ILD) 40 may be blanket deposited over the second dielectric spacer 35, and blanket deposited over the distal end of the fin structure 10 including the vertically orientated channel region, as well as being deposited over the dielectric cap 25. The interlevel dielectric layer (ILD) 40 may be composed of any dielectric material, such as an oxide, nitride or oxynitride material. In various embodiments, the interlevel dielectric (ILD) 40 is $SiO_2$. In various other embodiments, the interlevel dielectric (ILD) 40 is $Si_3N_4$. A portion of the inter-layer dielectric (ILD) material layer 40 may be removed by chemical-mechanical polishing to provide a flat, uniform surface, where the top surface of the inter-layer dielectric (ILD) material layer 40 may be coplanar with the top of the dielectric cap 25 that is present on the fin structure 10.

Figure 2:
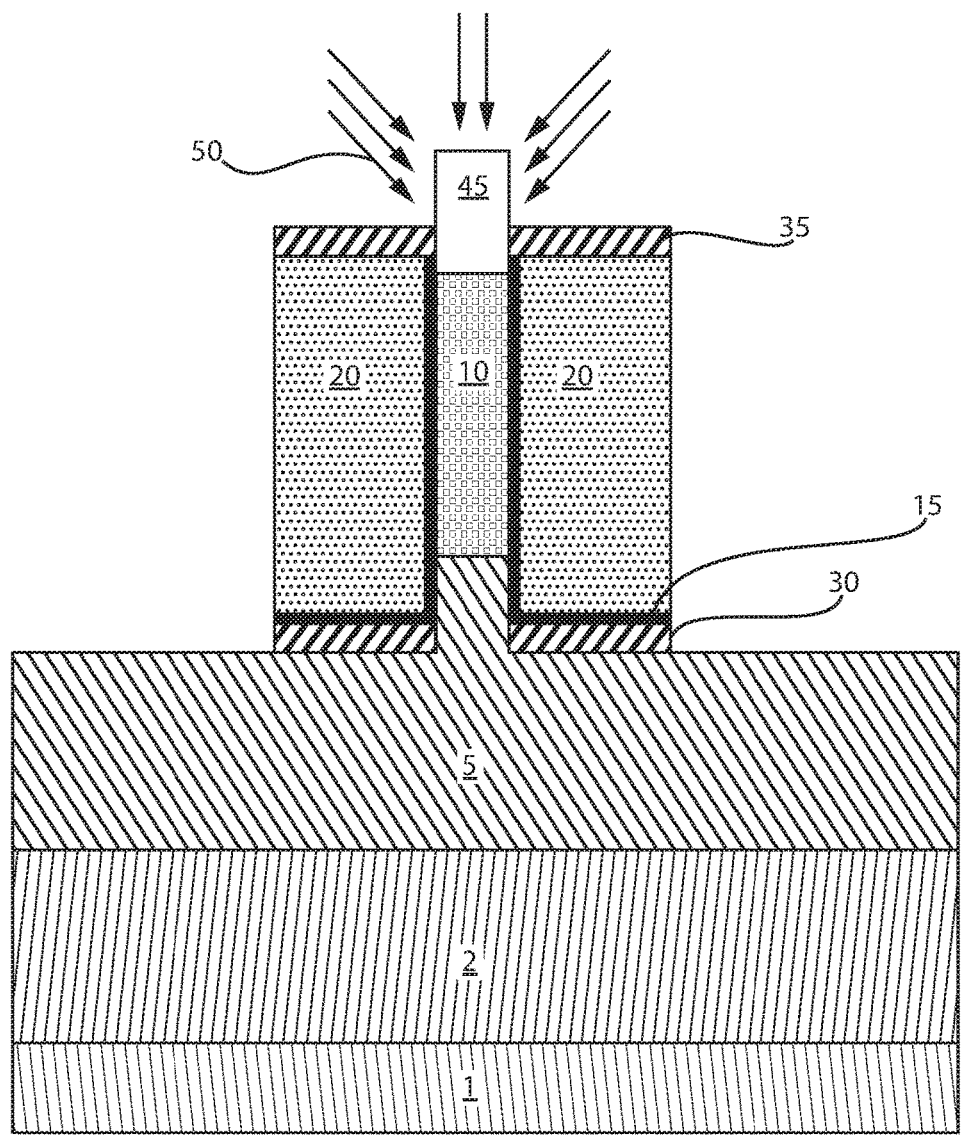
FIG. 2 is a side cross-sectional view depicting converting a portion of an exposed source/drain contact end of the vertically orientated channel region into an amorphous crystalline structure, in accordance with one embodiment of the present disclosure.

FIG. 2 depicts converting a portion of an exposed source/drain contact end of the fin structure 10 including the vertically orientated channel region into an amorphous crystalline structure. Removing the dielectric cap 25 and the interlevel dielectric layer 40 exposes the portion of the fin structure 10 that will be subsequently processed to provide the second source/drain region of the device. The dielectric cap 25 and the interlevel dielectric layer 40 may be removed by a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The dielectric cap 25 and the interlevel dielectric layer 40 may be removed using a wet or dry etch process. In one embodiment, the dielectric cap 25 and the interlevel dielectric layer 40 is removed by reactive ion etch (RIE).

Following removal of the dielectric cap 25 and the interlevel dielectric layer 40, a portion of the fin structure 10 that extends above the second dielectric layer 35 is exposed. The exposed portion of the second dielectric layer 35 is converted into an amorphous material 45 by an amorphous region forming dopant. Prior to the method steps for converting the exposed portion of the fin structure 10 to an amorphous material 45, the entirely of the fin structure 10 that contains the vertically orientated channel region is typically crystalline. The term "crystalline" includes single crystal and polycrystalline crystal structures. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a polycrystalline structure is a form of semiconductor material made up of randomly oriented crystallites. In some embodiments, the fin structure 10 has a single crystal crystalline structure, e.g., the fin structure 10

The amorphous region forming dopant when implanted 50 into the fin structure 10 changes the crystal structure of the fin structure, i.e., impacts the crystalline lattice, to change the crystalline material to an amorphous crystal state, i.e., produces an amorphous material 45. The term "amorphous" denotes that the non-crystalline solid is a solid that lacks the long-range order characteristic of a crystal.

The amorphous region forming dopant is ion implanted 50, in which the mass of the amorphous region forming dopant is selected to impact the crystal lattice of the fin structure 10 in a manner that converts it to an amorphous material 45, and does not substantially diffuse in concentrations to depths beyond those at which the extension region for the corresponding source/drain region, i.e., second source/drain region, is to be positioned. The amorphous region forming dopant is also selected so that it does not contribute electrically to the vertically orientated channel region, as well as the source and drain regions of the device, i.e., the amorphous region forming dopant does not contribute the concentration of the n-type/p-type dopants in the device.

In some embodiments, the amorphous region forming dopant is selected from the group consisting of argon (Ar), silicon (Si), germanium (Ge), helium (He), neon (Ne), krypton (Kr), xenon (Xe) and combinations thereof. The amorphous region forming dopant is implanted 50 into the exposed end of the fin structure 10 using ion implantation. Ion implantation is a materials engineering process by which ions of a material, e.g., the amorphous region forming dopant, such as germanium, are accelerated in an electrical field and impacted into a solid. In some embodiments, to convert the exposed end of the fin structure 10 to an amorphous material 45, the amorphous region forming dopant is implanted at an energy ranging from 2 keV to 10 keV. In another embodiment, to convert the exposed end of the fin structure 10 into an amorphous material 45, the amorphous region forming dopant may be implanted at an energy ranging from 4 keV to 8 keV. In some embodiments, to convert the exposed end of the fin structure 10 into an amorphous crystalline material, the amorphous region forming dopant is implanted into the exposed end of the fin structure 10 at a concentration ranging from $1 \times 10^{13}$ $cm^{-2}$ to $1 \times 10^{15}$ $cm^{-2}$. In another embodiment, to convert the exposed end of the fin structure 10 into an amorphous material 45, the amorphous region forming dopant is implanted into the exposed end of the fin structure 10 at a concentration ranging from $5 \times 10^{13}$ $cm^{-2}$ to $5 \times 10^{14}$ $cm^{-2}$. The portion of the fin structure 10 that is converted into an amorphous material 45 may range from the upper surface of the fin structure 10 to a depth below the lower surface of the second dielectric spacer 35, as depicted in FIG. 2.

Figure 3:
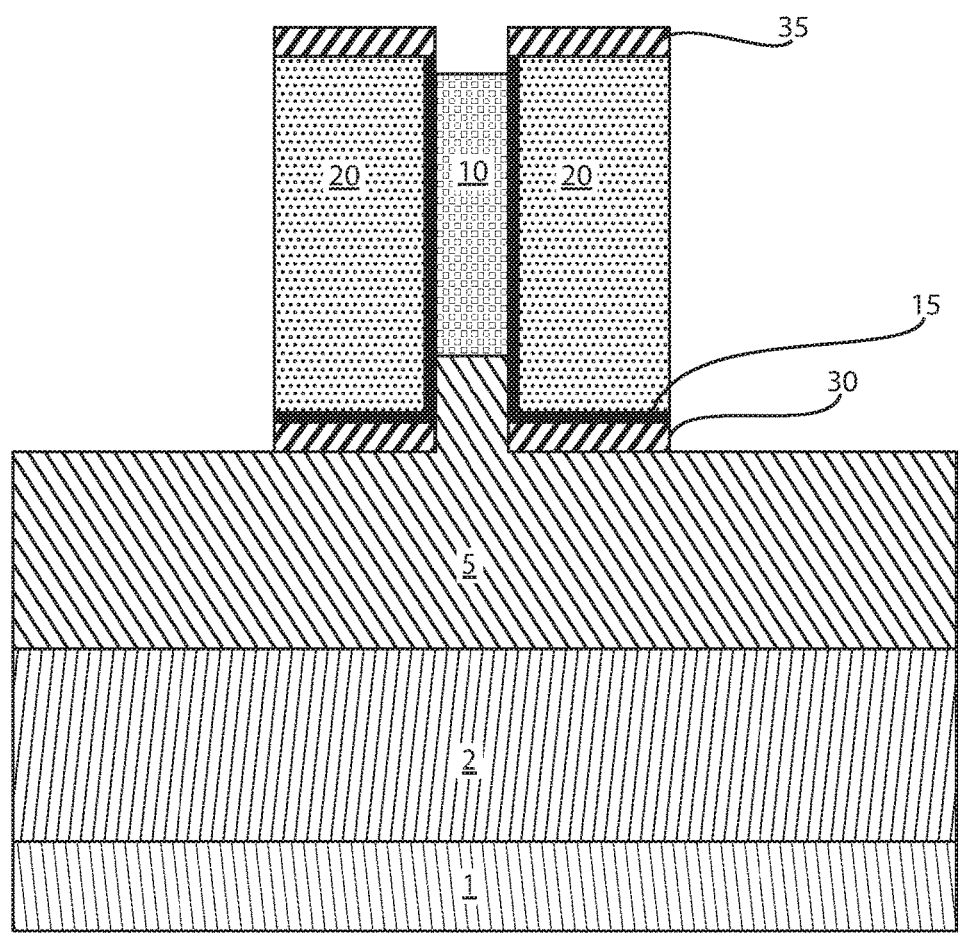
FIG. 3 is a side cross-sectional view depicting removing the amorphous crystalline structure selectively to the remainder of the vertically oriented channel region that has a non-amorphous crystal structure, in accordance with one embodiment of the present disclosure.

FIG. 3 depicts removing the amorphous material 45 of the fin structure 10 selectively to the remainder of the vertically oriented channel region that has a non-amorphous crystal structure. The etch process for selectively removing the amorphized material may be a wet chemical etch. Converting the exposed portion of the fin structure 10 to an amorphous material while the remainder of the fin structure is crystalline allows for the amorphous portion of the fin structure 10 to be removed by a wet etch that does not substantially etch the portion of the fin structure 10 that has a crystalline crystal structure. For example, when the fin structure 10 is composed of silicon, e.g., monocrystalline silicon, the portion of the fin structure 10 that has been converted to an amorphous material can be selectively removed using a hydrochloric etch (HCl). The hydrochloric etch composition is only one example of a selective etch composition that is suitable for removing the portion of the structure 10 that has been converted to amorphous material. Any etch composition that can remove the amorphous material selectively to the remaining crystalline portion of the fin structure 10 is suitable for use with the present disclosure. In some embodiments, the etch process for removing the amorphous material is also selective to the second dielectric spacer 35 and the first source/drain region 5.

Figure 4:
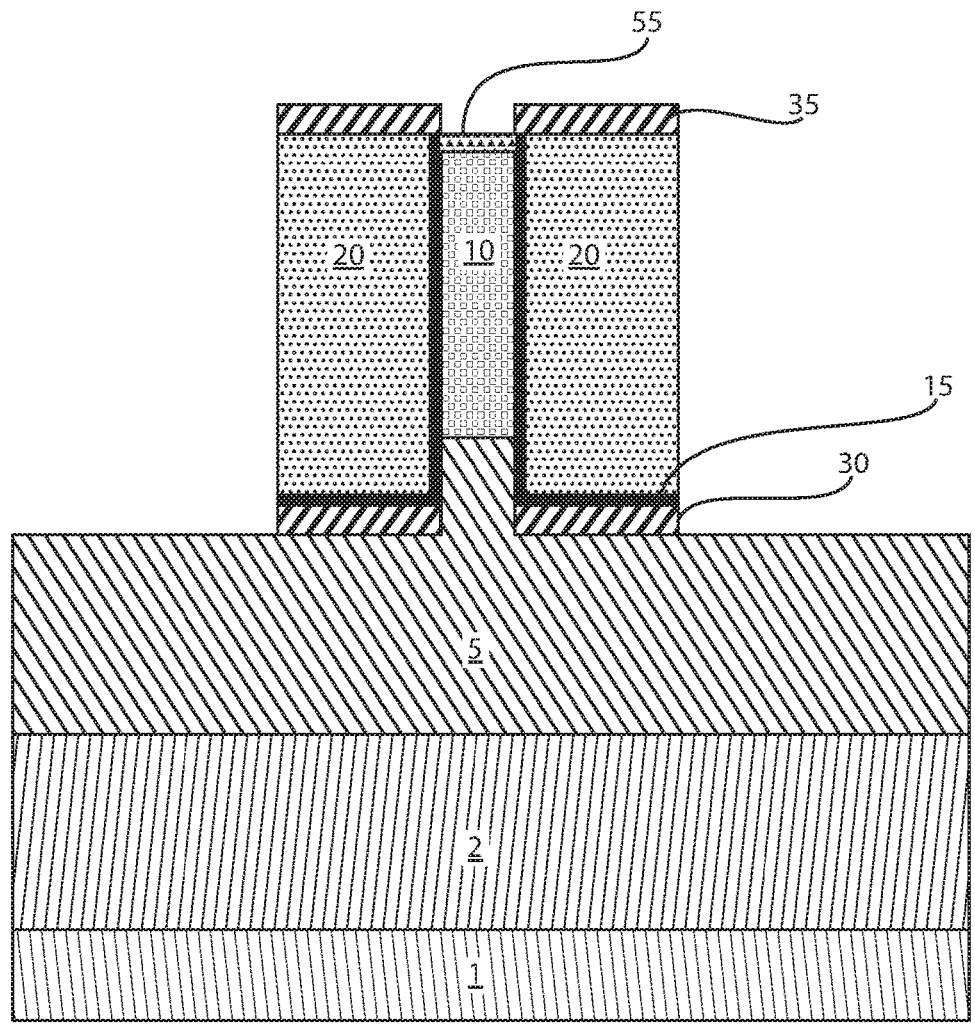
FIG. 4 is a side cross-sectional view depicting one embodiment of an in-situ doped extension region layer being epitaxially formed on an exposed surface of the vertically orientated channel region.

FIG. 4 depicting one embodiment of an in-situ doped extension region layer 55 being epitaxially formed on an exposed surface of the fin structure 10 containing vertically orientated channel region after removing the amorphous material portion. The remaining portion of the fin structure 10 has a crystalline crystal structure, e.g., may be composed of monocrystalline silicon (c-Si), which provides a crystalline surface for epitaxial growth of the in-situ extension region layer 55. The crystalline surface of the fin structure 10 is positioned just below the lower surface of the second dielectric spacer 35. This provides a precise location for the extension region for the subsequently formed second source/drain region. The in-situ doped extension region layer 55 may have a thickness ranging from 1 nm to 10 nm. In other embodiments, the in-situ doped extension region layer 55 may have a thickness ranging from 2 nm to 5 nm. The in-situ doped extension region is at a depth below the second dielectric spacer 35.

The in-situ doped extensions region layer 55 may be composed of a type IV or type III-V semiconductor material. Any of the type IV and type III-V semiconductor materials that have been described above for the supporting substrate 1 are suitable for providing the in-situ doped extension region layer 55. For example, the type IV semiconductor material that provides the in-situ doped extension region layer 55 may be composed of silicon (Si). In other examples, the type IV semiconductor material may include germanium (Ge), e.g., silicon germanium (SiGe).

The epitaxial deposition process for forming the in-situ doped extension layer 55 may be a selective growth process. By "selective growth" it is meant that the epitaxial material for the in-situ doped extension layer 55 is formed on semiconductor surfaces, such as the exposed surface of the fin structure 10, but is not formed on dielectric surfaces, such as the second dielectric spacer 35. A mask may be employed to cover exposed portions of the first source/drain region 5 at this stage of the process flow.

The epitaxial deposition process for forming the in-situ doped extension layer 55 is similar to the epitaxial deposition process that is described above for the fin structure 10 and the first source/drain region. For example, if the in-situ doped extension layer 55 is composed of epitaxial silicon, i.e., crystalline silicon, e.g., monocrystalline silicon, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), and combinations thereof. In another example, when the in-situ doped extension layer 55 is composed of a germanium containing material, like SiGe, the epitaxially formed second semiconductor layer 30 may be composed of germanium (Ge), the germanium containing gas sources for epitaxial growth include germane ($GeH_4$), digermane ($Ge_2H_6$), halogermane, dichlorogermane, trichlorogermane, tetrachlorogermane and combinations thereof.

In some embodiments, the in-situ doped extension layer 55 is doped to an n-type conductivity or p-type conductivity to have the same conductivity type as the first source/drain region 5. The dopant concentration of the n-type or p-type dopant is less in the in-situ doped extension layer 55 than the dopant concentration in the first source/drain region 5 and/or the subsequently formed second source/drain region. In one example, the n-type or p-type dopant concentration for the in-situ doped extension layer 55 ranges from $1 \times 10^{19}$ atoms/$cm^3$ to $5 \times 10^{19}$ atoms/$cm^3$. The n-type or p-type conductivity dopant is introduced to the epitaxial semiconductor material of the in-situ doped extension layer 55 during the formation of the material layer, in which the dopant may be uniform in concentration from the lower surface of the in-situ doped extension layer 55 to the upper surface of the in-situ doped extension layer 55.

Figure 5:
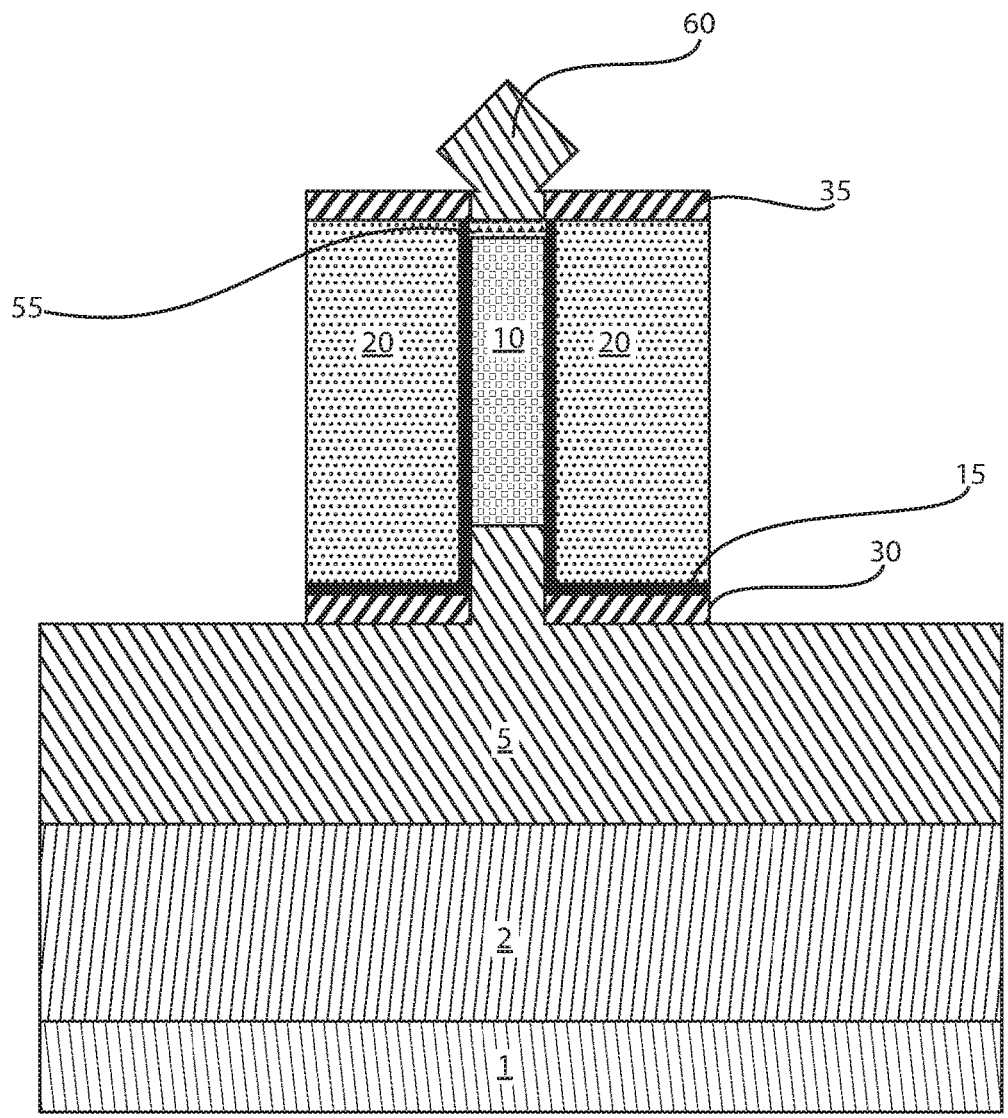
FIG. 5 is a side cross-sectional view depicting epitaxially forming a second source/drain region on the in-situ doped extension region, in accordance with one embodiment of the present disclosure.

FIG. 5 depicts epitaxially forming a second source/drain region 60 on the in-situ doped extension region 55. In some embodiments, the second source/drain region 60 is a source region when the first source/drain region 5 is a drain region. In some other embodiments, the second source/drain region 60 is a drain region when the first source/drain region is a source region. The second source/drain region 60 is composed of a type IV semiconductor or a type III-V semiconductor material. Any of the type IV semiconductor or type III-V semiconductor materials that have been described above for the supporting substrate are suitable for providing examples of the semiconductor materials that can be suitable for the second source/drain region 60. The semiconductor material of the second source/drain region 60 is typically crystalline, e.g., having a single crystal crystalline structure. In some embodiments, the source/drain region 60 is composed of silicon, e.g., monocrystalline silicon.

The second source/drain region 60 may be epitaxially formed. The epitaxial growth process for forming the second source/drain region 60 is similar to the epitaxial grow process for forming the in-situ doped extension layer 55. Therefore, some of the process conditions described for forming the in-situ doped extension layer 55 is suitable for providing some examples for the process conditions for forming the second source/drain region 60. For example, the epitaxial deposition process for forming the second source/drain region 60 may be a selective deposition process that only aligns the semiconductor material being formed to semiconductor surfaces, such as the exposed surface of the in-situ doped extension region 55, and is not formed on dielectric surfaces, such as the second dielectric spacer 35.

In some embodiments, forming the second source/drain region 60 may include epitaxially forming the second source/drain region 60 on the in-situ doped extension region 55, which may include in-situ doping with a same conductivity type dopant as the conductivity type dopant that is present in the in-situ doped extension region 55, wherein the conductivity type dopant concentration in the source/drain region 60 is greater than the dopant concentration of the conductivity type dopant in the in-situ doped extension region 55. In one example, the n-type or p-type dopant concentration for the second source/drain region 60 ranges from $1 \times 10^{20}$ atoms/$cm^3$ to $5 \times 10^{21}$.

FIG. 6 depicts one embodiment of a semiconductor device that includes a first source/drain region 5 on a supporting substrate 1, and a vertically orientated channel region (positioned within the fin structure 10 between the first source/drain region 5 and the second source/drain region 60). The stack of the source region layer 9, the channel region (i.e., first in-situ doped epitaxial semiconductor material 20, and second in-situ doped epitaxial semiconductor material 25), and the drain region in a direction of stacking perpendicular to the upper surface of the supporting substrate 1 may be referred to as "vertically orientated". An extension 65 of the first source/drain region 5 is present at a first end of the vertically orientated channel region and includes a portion of the doped semiconductor material that provided the first source/drain region 5. Because the extension 65 is formed of the same material as the first source/drain region 5, the extension 65 and the first source/drain region 5 will be composed of a same composition semiconductor, be doped to a same conductivity type, and will have a same concentration of dopant that provides the conductivity type of the extension 65 and the first source/drain region 5.

An epitaxial uniformly doped extension region layer 55 is present at a second end of the vertically orientated channel region. The epitaxial uniformly doped extension region layer 55 has been described above in reference to FIGS. 1-5 as the in-situ doped extension region 55, in which the terms for this structure may be used interchangeably. The epitaxial uniformly doped extension region layer 55 is at a depth below the second dielectric spacer. The epitaxially uniformly doped extension region layer has a thickness ranging from 1 nm to 10 nm. The epitaxial uniformly doped extension region layer 55 may be composed of a different base semiconductor material than the vertically orientated channel region. By "base semiconductor material" it is meant the type IV or type III-IV semiconductor material without including p-type and n-type dopants. In other embodiments, the epitaxial uniformly doped extension region layer 55 is composed of a same base semiconductor material as the vertically orientated channel region.

Still referring to FIG. 1, the second source/drain region 60 is present on the epitaxial uniformly doped extension region layer 55. The second/drain region 60 may be composed of a same or different base material as the epitaxial uniformly doped extension region layer 55. The second source/drain region 60 is typically doped to the same conductivity type as the epitaxial uniformly doped extension region layer 55, but the dopant concentration for the p-type or n-type dopant in the second source/drain region 60 is greater than the dopant concentration in the epitaxial uniformly doped extension region layer 55. The epitaxial uniformly doped extension region layer 55 is a separate layer from the vertically orientated channel region 10 and the second source/drain region 60. By "separate layer" it is meant that a first discernible interface is present between the vertical oriented channel region 10 and the epitaxial uniformly doped extension region layer 55, and a second discernible interface is present between the second source/drain region 60 and the epitaxial uniformly doped extension region layer 55.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   a first source/drain region on a supporting substrate;
   a vertically orientated channel region, wherein an extension of the first source/drain region is present at a first end of the vertically orientated channel region includes a portion of the doped semiconductor material that provided the first source/drain region;
   an epitaxial uniformly doped extension region layer present at a second end of the vertically orientated channel region; and
   a second source/drain region epitaxially formed on the epitaxial uniformly doped extension region layer present at the second end of the vertically orientated channel region, the second source/drain region having a diamond geometry with sidewall having an apex.

2. The semiconductor device of claim 1, wherein the supporting substrate includes a punch through stop layer over a type IV semiconductor base.

3. The semiconductor device of claim 1, further comprising a gate structure on the vertically orientated channel region and separated from the first source/drain region by a first dielectric spacer layer.

4. The semiconductor device of claim 1, wherein the epitaxial uniformly doped extension region layer is composed of a different base semiconductor material than the vertically orientated channel region.

5. The semiconductor device of claim 1, wherein the epitaxial uniformly doped extension region layer is composed of a same base semiconductor material than the vertically orientated channel region.

6. The semiconductor device of claim 1, wherein the epitaxial uniformly doped extension region layer is at a depth at and below the second dielectric spacer.

7. The semiconductor device of claim 1, wherein the epitaxially uniformly doped extension region layer has a thickness ranging from 1 nm to 10 nm.

8. The semiconductor device of claim 1, wherein the semiconductor device is a vertical field effect transistor.

9. A semiconductor device comprising:
   a first source/drain region on a supporting substrate;
   a vertically orientated channel region;
   an epitaxial extension region layer present at a second end of the vertically orientated channel region; and
   a second source/drain region on the epitaxial uniformly doped extension region layer, wherein the epitaxial uniformly doped extension region layer is a separate layer from the vertically orientated channel region and the second source/drain region, the second source/drain region having a diamond geometry with sidewall having an apex.

10. The semiconductor device of claim 9, wherein the supporting substrate includes a punch through stop layer over a type IV semiconductor base.

11. The semiconductor device of claim 9, further comprising a gate structure on the vertically orientated channel region.

12. The semiconductor device of claim 11, the gate structure being separated from the first source/drain region by a first dielectric spacer layer.

13. The semiconductor device of claim 12, wherein the epitaxial extension region layer is at a depth at and below the second dielectric spacer.

14. The semiconductor device of claim 9, wherein a dopant concentration that provides the conductivity type of the epitaxial extension region layer is less than a dopant concentration that provides the conductivity type of the second source/drain region.

15. The semiconductor device of claim 9, wherein the epitaxial uniformly doped extension region layer is composed of a different base semiconductor material than the vertically orientated channel region.

16. The semiconductor device of claim 9, wherein the epitaxial extension region layer is composed of a same base semiconductor material than the vertically orientated channel region.

17. The semiconductor device of claim 9, wherein the epitaxially extension region layer has a thickness ranging from 1 nm to 10 nm.

18. The semiconductor device of claim 9, wherein the semiconductor device is a vertical field effect transistor.

19. A semiconductor device comprising:
a vertically orientated channel region;
a first source/drain region present at a first end of the vertically orientated channel region; and
an epitaxial uniformly doped extension region layer present at a second end of the vertically orientated channel region; and
a second source/drain region epitaxially formed on the epitaxial uniformly doped extension region layer present at the second end of the vertically orientated channel region, the second source/drain region having a diamond geometry with sidewall having an apex.

20. The semiconductor device of claim 19, wherein the epitaxially uniformly doped extension region layer has a thickness ranging from 1 nm to 10 nm.

* * * * *